United States Patent [19]
North et al.

[11] Patent Number: 5,446,691
[45] Date of Patent: Aug. 29, 1995

[54] INTERLEAVE TECHNIQUE FOR ACCESSING DIGITAL MEMORY

[75] Inventors: Tom North, Los Altos Hills; Francis Siu, Saratoga, both of Calif.

[73] Assignee: ShaBLAMM! Computer Inc., Cupertino, Calif.

[21] Appl. No.: 215,144

[22] Filed: Mar. 15, 1994

[51] Int. Cl.⁶ .............................................. G11C 8/00
[52] U.S. Cl. ........................... 365/189.02; 365/230.02; 365/230.03
[58] Field of Search ...................... 365/230.02, 230.03, 365/189.02, 189.03, 230.04, 52

[56] References Cited

U.S. PATENT DOCUMENTS

| | | | |
|---|---|---|---|
| 4,924,375 | 5/1990 | Fung et al. | 364/200 |
| 5,051,889 | 9/1991 | Fung et al. | 364/200 |
| 5,261,068 | 11/1993 | Gaskins et al. | 365/230.02 |
| 5,262,991 | 11/1993 | Pope | 365/230.02 |
| 5,359,717 | 10/1994 | Bowles et al. | 365/230.02 |

OTHER PUBLICATIONS

Specialty Memory Products, Ramtron International Corporation, Sep. 1993, pp. 17–33.
Bondurant, D., "Low Latency EDRAM Main Memory Subsystem for 66 MHz Bus Operation," *Proceedings of the IEEE/COMPCON*, Mar. 1994.
"EDRAM Controller for Intel Pentium 60 & 66 MHz Microporcessors", Ramtron International Corporation, 1993.

Primary Examiner—Joseph A. Popek
Assistant Examiner—Vu Le
Attorney, Agent, or Firm—Fenwick & West

[57] ABSTRACT

An electronic storage circuit includes a pair of banks, each bank having corresponding shared and unshared conductors. The banks may be dynamic random access memories (DRAMs), which are provided in a single inline memory module (SIMM). Each DRAM includes an array of bit cells arranged in rows and columns. A shared conductor of one bank is connected to the unshared conductor of the other bank, and the unshared conductor of such one bank is connected to the shared conductor of such other bank. Row and column address signals are applicable to the connections between the banks, thereby allowing selectable access (or write) to the banks. Each bank includes corresponding data and output enable conductors, such that in response to output enable signals applied to such output enable conductors, data signals are generated by corresponding banks at the data conductors, depending on the state of the applied address signals.

11 Claims, 3 Drawing Sheets

INTERLEAVE TECHNIQUE FOR ACCESSING DIGITAL MEMORY

BACKGROUND OF THE INVENTION

1. Field of the Invention

The invention relates to the field of electronic storage devices, particularly to interleave techniques for accessing digital memory circuits.

2. Description of Background Art

Conventional computer and electronic systems store and retrieve digital data in memory circuits, typically provided in semiconductor chips as dynamic random access memories (DRAMs). To improve system performance, various techniques are known for reducing time to access storage locations in digital memory. For example, U.S. Pat. Nos. 5,051,889, and 4,924,375 describe "page-interleaving" techniques wherein improved access times are achieved by accessing sequential memory pages which are interleaved between memory banks, such that accesses to bits in the same page as a previous access omit the row pre-charge cycle.

Additionally, as conventional electronic systems are increasingly designed according to board specifications which impose smaller physical constraints, there is less room being provided for components, such as DRAM chips. Thus, there is a need to define an approach for providing high-performance electronic storage in a physically more efficient manner.

One approach involves placing DRAM components in Single In-line Memory Modules (SIMMs). In this way, such SIMMs may be installed in banks to provide the total amount of memory desired. However, conventional interleaving techniques for accessing storage locations in SIMMs require a minimum of two banks, with memory expanding in increments of two banks. Thus, in systems where there is only enough space for two banks of memory, this requirement limits system designers from having an easy upgrade path to add more memory.

Instead, such designers need to remove all memory components from the system and replace such components with larger SIMMs to perform the desired upgrade. Because this approach leads to wasteful and expensive system memory upgrades, a better technique for digital storage is needed.

Another limitation of conventional interleave approaches for accessing digital memory from multiple storage banks is that separate address buses are used for each bank. In this way, at least one of the addresses in each bank changes at a different time in order to obtain the benefit of longer access time. Because this approach requires separate banks in increments of two, there is a need for an improved technique for accessing such digital memory.

SUMMARY OF THE INVENTION

The invention resides in a digital memory having at least one pair of bank circuits, each circuit having corresponding multiplexed and non-multiplexed pins. A multiplexed pin of one circuit is coupled to the non-multiplexed pin of the other circuit, and the non-multiplexed pin of such one circuit is coupled to the multiplexed pin of such other circuit. In this way, address signals are applied to the couplings between the circuits, thereby allowing selectable accessing of the circuits.

Each bank circuit includes corresponding data and output enable pins, such that in response to output enable signals applied to such output enable pins, data signals are generated by corresponding circuits at the data pins, preferably according to the state of the applied address signals. The data pins may be coupled together so that the data signals are generated to define a common signal.

Preferably, the bank circuits are dynamic random access memories (DRAMs), which are provided in a single inline memory module (SIMM). Each DRAM includes an array of storage locations arranged in rows and columns.

During operation, a row address signal is applied initially to address a row in both banks. Subsequently, a column address signal is applied to address a first column in the first DRAM. Then another column address signal is applied to address a first column in the second DRAM.

Furthermore, in response to the first column in the first DRAM being addressed by the first column address signal, a first output enable signal is applied to the first bank circuit to generate a first data signal. Similarly, in response to the first column in the second DRAM being addressed by the second address signal, a second output enable signal is applied to the second bank circuit to generate a second data signal.

Moreover, the first address signal is applicable thereafter, such that the first address signal is applied to address a subsequent column in the first DRAM. Also, the second address signal is applied thereafter, such that the second address signal is applied to address a subsequent column in the second DRAM.

In response to the subsequent column in the first DRAM being addressed by the first address signal, the first output enable signal is applied to the first bank circuit to generate a third data signal. Likewise, in response to the subsequent column in the second DRAM being addressed by the second address signal, the second output enable signal is applied to the second bank circuit to generate a fourth data signal. Preferably, the first, second, third and fourth data signals generated consecutively a common data signal.

DETAILED DESCRIPTION OF THE PREFERRED EMBODIMENTS

Figure 1:
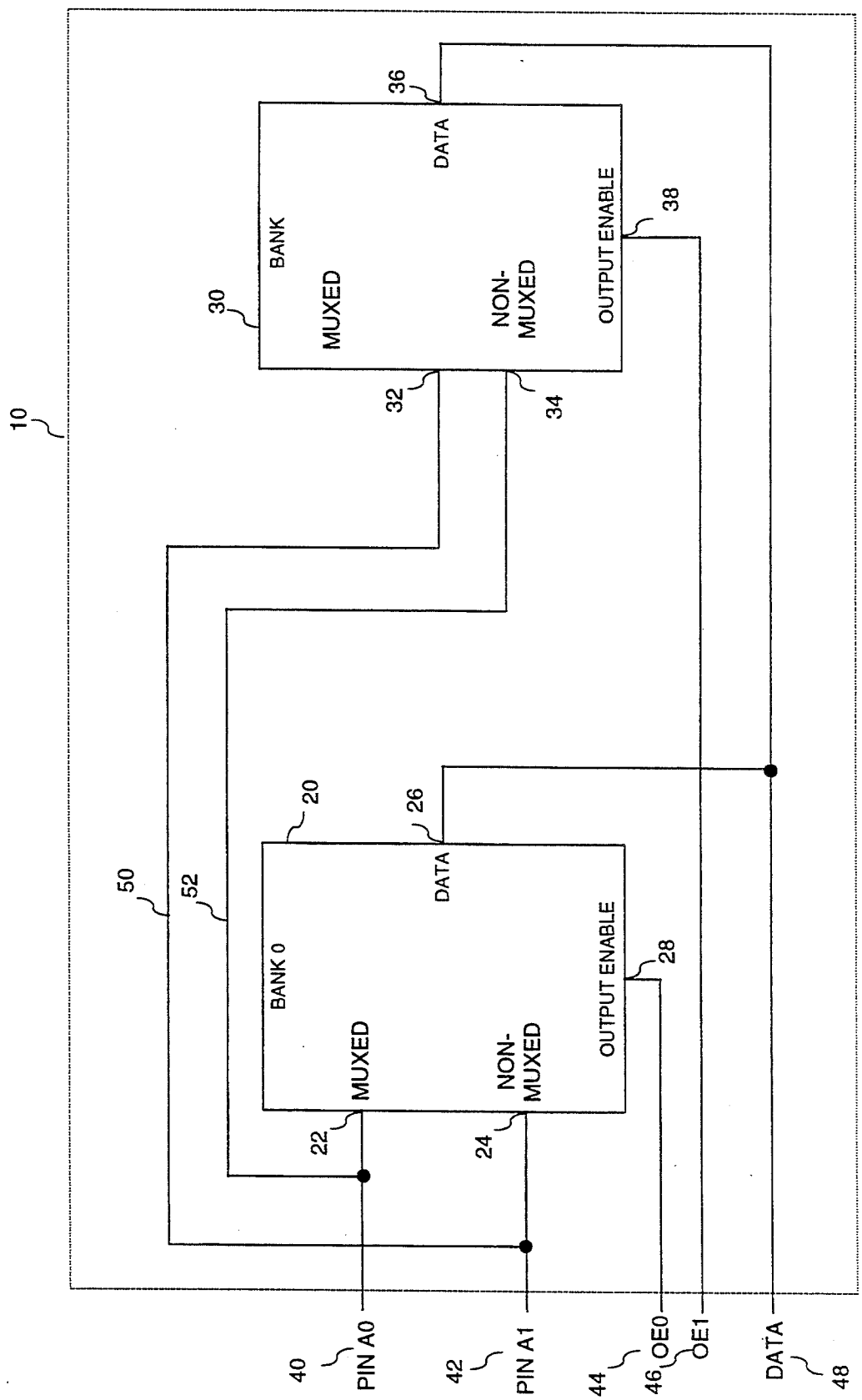
FIG. 1 is generalized block diagram of an electronic storage apparatus according to the present invention.

FIG. 1 is a block diagram of electronic digital storage or memory circuit or subsystem 10. Preferably, storage 10 is provided as a single inline memory module (SIMM) or other relatively small-footprint memory board having multiple portions or banks 20, 30 in which digital data may be stored and retrieved by an associated controller or system (not shown).

Figure 3:
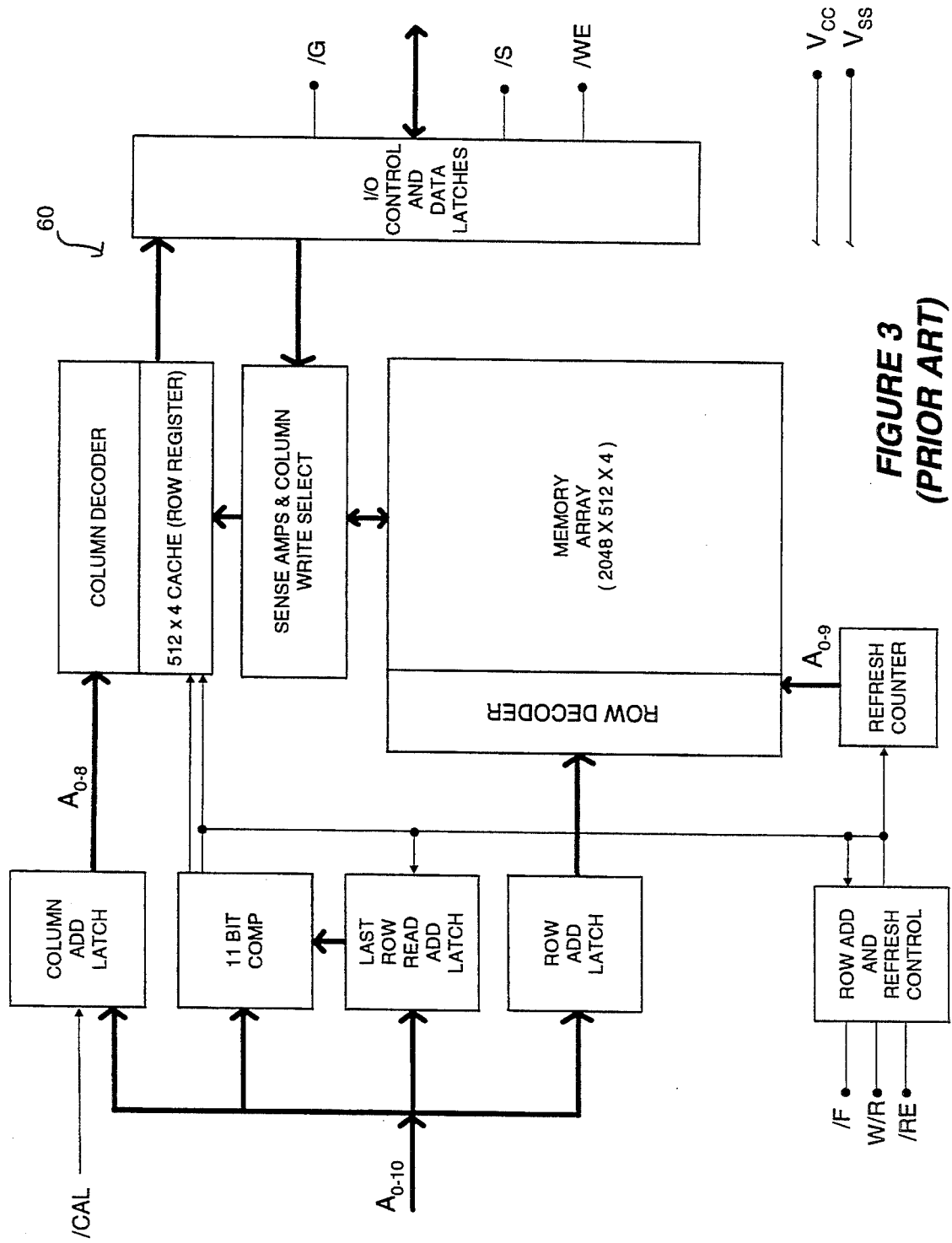
FIG. 3 is a functional block diagram of prior art memory device usable in conjunction with the present invention.

Preferably, storage 10 is a 1 Mb×4 Enhanced Dynamic Random Access Memory (EDRAM), part number DM2202/2212, which is shown in the functional diagram in FIG. 3. Such EDRAM component features a multiplexed address bus and is available commercially from Ramtron International Corporation (Colorado Springs, Colo.), as described in a product specification cited herewith and hereby incorporated by reference. It is contemplated, nonetheless, that storage 10 may be implemented as well using any comparable memory part having multiple banks, each bank having corresponding shared and unshared conductors for coupling address signals to the part.

In accordance with the present invention, storage 10 is provided having at least one pair of bank circuits 20, 30. Each circuit 20, 30 is preferably a DRAM circuit having corresponding shared or multiplexed conductors or pins 22, 32 and unshared or non-multiplexed conductors or pins 24, 34.

In particular, multiplexed pin 22 of circuit 20 is coupled electrically to non-multiplexed pin 34 of other circuit 30, and non-multiplexed pin 24 of circuit 20 is coupled electrically to multiplexed pin 32 of other circuit 30. As defined herein, the term "multiplex" means that certain signal ports or channels 22, 32 are used for transmitting various, multiple signals therethrough (e.g., row and column addressing signals).

Moreover, the term "non-multiplex" refers to such signal ports or channels 24, 34 which are used only for transmitting particular signals therethrough (e.g., only row address signal or only column address signal). Hence, row or column addressing signals may be applied to couplings 50, 52 between circuits 20, 30, thereby enabling selectable or user-controlled accessing of data circuits for reading thereto or writing therefrom.

Thus, the present invention advantageously provides high-performance memory interleaving, without the penalty of having multiple SIMM banks or the penalty of additional address lines or pins. By providing intra-SIMM interleaving, the performance advantage of interleaving is available even when only one bank of memory is present. But the preferred approach involves using two (or more) banks 20, 30 of memory per SIMM 10.

Also, by cross-wiring a non-multiplexed memory address pin 24, 34, according to the present invention, with a multiplexed address pin 22, 32 on the other bank and vice versa, it is possible to provide address setup time to each bank 20, 30 without requiring additional address pins. The multiplexed memory address has both row and column addresses active. The non-multiplexed memory address has only the row address active.

In the case of using the preferred Ramtron EDRAM component, which employs a multiplexed address bus, eleven bits are provided for row addressing, and nine bits are provided for column addressing. Here, certain bits unused for column addressing are used for sending unique addressing signals to each bank of EDRAM, thereby insuring that after address hold time requirements of EDRAM in bank 20 is met, address to that bank can change without affecting addresses to bank 30. This technique allows next address to begin satisfying column access time requirement for the next location in the EDRAM in bank 20 at the earliest possible time.

Consequently, when a column address is presented on pin A0 40 of storage or SIMM 10, only bank 20 receives it, and, conversely, when column address 202, 203 is presented on pin A1 42 of SIMM 10, only bank 30 receives it. This way, column address of bank 30 is controlled with multiplexed address pin 32, without affecting bank 20 with non-multiplexed address pin 24, because during column address portion of the cycle, the address presented on non-multiplexed address pin 24, 34 is ignored.

Memories 20, 30 respond only to column addresses presented on multiplexed address pins 22, 32. Separate output control signals 28, 38 are used during read cycles to access each bank 20, 30 at appropriate times 207, 208, 209, 210. This maintains pinout compatibility with JEDEC standard SIMMs.

As preferably implemented, each bank circuit 20, 30 includes corresponding data pins 26, 36 and output enable pins 28, 38, such that in response to output enable signals (OE0, OE1) 44, 46 applied to such output enable pins 28, 38, data signals 48 are generated by corresponding circuits 20, 30 at data pins 26, 36, preferably according to logical value or state transition of applied address signals (A0, A1) 40, 42. Data pins 26, 36 may be coupled together electrically so that data signals are generated to define common signal (DATA) 48.

Figure 2:
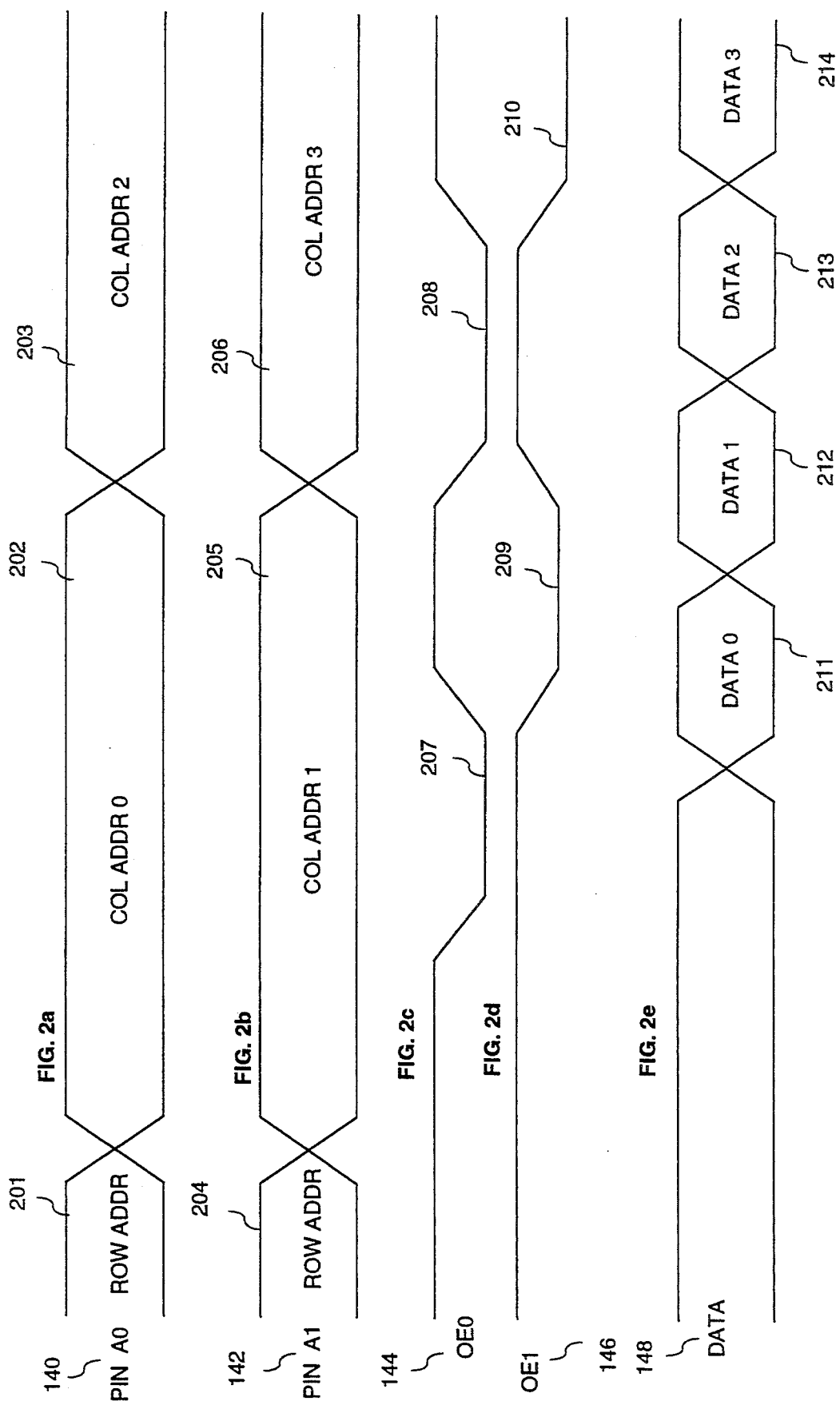
FIG. 2 is a representative timing diagram of relevant electrical signals for operating the apparatus of FIG. 1 according to the present invention.

During operation of storage 10, as shown in timing diagrams for representative signals 40, 42, 44, 46, 48 in FIG. 2, first address signal 140 is applied to address particular first row 201 in first bank 20 during a first given time period, transition window or event. First address signal 140 is then applied to address column (COL ADDR 0) 202 in bank 20.

Additionally, second address signal 142 is applied during a second given time period, transition window or event to address second row 204 in second bank 30, and second address signal 142 is then applied to address column (COL ADDR 1) 205 in second bank 30.

Furthermore, in response to column 202 being addressed by first address signal 140, first output enable signal 144 is applied 207 to first bank circuit 20 to generate first data signal (DATA0) 211. Similarly, in response to column 205 being addressed by second address signal 142, second output enable signal (OE1) 146 is applied 209 to second bank circuit 30 to generate second data signal (DATA1) 212.

Moreover, first address signal 140 is applied during subsequent given time period, transition window or event after first address signal 140 is applied 202 to address column 202, such that later, first address signal 140 is applied to address column (COL ADDR 2) 203 in first bank 20. Also, second address signal 142 is applied during subsequent given time period, transition window or event, after second address signal 142 is applied to address column 205, such that later second address signal 142 is applied to address column (COL ADDR 3) 206 in second bank 30.

In response to column 203 being addressed by first address signal 140, output enable signal 144 is applied 208 to bank circuit 20 to generate third data signal (DATA2) 213. Likewise, in response to column 206 being addressed by second address signal 142, output enable signal 146 is applied 210 to bank circuit 30 to generate fourth data signal (DATA3) 214. Preferably, first, second, third and fourth data signals 211, 212, 213, 214 are generated consecutively to provide common data signal 148, 48.

Hence, in summary, interleaved memory access is performed in bursts of four. At first, row address 201, 204 is presented to both banks 20, 30 and latched at the same time. Then starting column addresses 202, 205 are presented to both banks 20, 30. After waiting for specified access time, first word of data 211 is gated 207 onto data bus 48 from bank 20 by output enable 44. Then next word of data 212 is provided from bank 30.

In the meantime, column address is changed to bank 20. Each subsequent access has two cycles to complete instead of only one. For example, DRAM with column address access of 20 ns has 30 ns to provide data if each memory cycle is 15 ns. With the present invention, multiplexed address line of one bank 20 is shared with the non-multiplexed line of other bank 30, thereby eliminating overhead of using additional address bus.

In an alternate embodiment of the present invention, banks 20, 30 are interconnected 50, 52 as shown in FIG. 1. However, the interleaved operation described above in read access mode is performed alternatively in write mode.

In particular, address signals 140, 142 are applied similarly as before, but instead of applying output enable signals 144, 146 to read storage locations and generate data signal 148, write enable signals and corresponding data signals are applied, for example, as detailed for write operations in the cited product specification for the DM2202/2212 memory part.

We claim:

1. A digital memory comprising:
    a first memory circuit having a first multiplexed pin and a first non-multiplexed pin; and
    a second memory circuit having a second multiplexed pin and a second non-multiplexed pin;
    wherein the first multiplexed pin is coupled via a first coupling to the second non-multiplexed pin, and the first non-multiplexed pin is coupled via a second coupling to the second multiplexed pin, such that a first address signal is applicable to the first coupling to access data in the first memory circuit, and a second address signal is applicable to the second coupling to access data in the second memory circuit.

2. The memory of claim 1 wherein:
    the first memory circuit further comprises a first data pin and a first output enable pin;
    the second memory circuit further comprises a second data pin and a second output enable pin;
    wherein in response to a first output enable signal applied to the first output enable pin, a first data signal is generated by the first memory circuit at the first data pin according to a first state of the first address signal; and
    wherein in response to a second output enable signal applied to the second output enable pin, a second data signal is generated by the second memory circuit at the second data pin according to a second state of the second address signal.

3. The memory of claim 2 wherein the first data pin is coupled to the second data pin for providing a common data signal responsive to the first data signal and the second data signal.

4. The memory of claim 1 wherein the first memory circuit comprises a first dynamic random access memory (DRAM), and the second memory circuit comprises a second DRAM, the first and second DRAM being provided in a single inline memory module (SIMM).

5. The memory of claim 4 wherein:
    the first DRAM comprises a first array of storage locations arranged in rows and columns;
    the second DRAM comprises a second array of storage locations arranged in rows and columns;
    wherein the first address signal is applicable during a first time interval to address a first row in the first DRAM, the first address signal being applicable after the first time interval to address a first column in the first DRAM; and
    wherein the second address signal is applicable during a second time interval to address a second row in the second DRAM, the second address signal being applicable after the second time interval to address a second column in the second DRAM.

6. The memory of claim 5 wherein:
    in response to the first column being addressed by the first address signal, a first output enable signal is applied to the first memory circuit to generate a first data signal; and
    in response to the second column being addressed by the second address signal, a second output enable signal is applied to the second memory circuit to generate a second data signal.

7. The memory of claim 6 wherein:
    the first address signal is applicable during a third time interval after the first address signal is applied to address the first column, such that during the third time interval the first address signal is applicable to address a third column in the first DRAM; and
    the second address signal is applicable during a fourth time interval after the second address signal is applied to address second column, such that during the fourth event the second address signal is applicable to address a fourth column in the second DRAM.

8. The memory of claim 7 wherein:
    in response to the third column being addressed by the first address signal, the first output enable signal is applied to the first memory circuit to generate a third data signal; and
    in response to the fourth column being addressed by the second address signal, the second output enable signal is applied to the second memory circuit to generate a fourth data signal.

9. The memory of claim 8 wherein the first, second, third and fourth data signals are generated consecutively to provide a common data signal.

10. A method for operating a digital memory having a first memory circuit and a second memory circuit, each memory circuit having a corresponding multiplexed pin and non-multiplexed pin, the method comprising the steps of:
    coupling via a first connection a multiplexed pin of a first memory circuit to a non-multiplexed pin of a second memory circuit;
    coupling via a second connection a multiplexed pin of the second memory circuit to a non-multiplexed pin of the first memory circuit;
    applying a first address signal to the first connection to access data in the first memory circuit; and
    applying a second address signal to the second connection to access data in the second memory circuit.

11. An electronic storage device comprising:
    a first memory having a first shared conductor and a first unshared conductor; and
    a second memory having a second shared conductor and a second unshared conductor;
    wherein the first shared conductor is coupled via a first connection to the second unshared conductor, and the first unshared conductor is coupled via a second connection to the second shared conductor, such that a first address signal is applicable to the first connection to write data to the first memory, and a second address signal is applicable to the second connection to write data to the second memory.

* * * * *